(12) United States Patent
Xie et al.

(10) Patent No.: US 8,679,968 B2
(45) Date of Patent: Mar. 25, 2014

(54) METHOD FOR FORMING A SELF-ALIGNED CONTACT OPENING BY A LATERAL ETCH

(75) Inventors: Ruilong Xie, Albany, NY (US); Su Chen Fan, Cohoes, NY (US); Pranatharthiharan Haran Balasubramanian, Watervliet, NY (US); David Vaclav Horak, Essex Junction, NY (US); Ponoth Shom, Gaithersburg, MD (US)

(73) Assignee: GlobalFoundries Singapore Pte. Ltd, Singapore (SG)

( * ) Notice: Subject to any disclaimer, the term of this patent is extended or adjusted under 35 U.S.C. 154(b) by 0 days.

(21) Appl. No.: 13/471,846

(22) Filed: May 15, 2012

(65) Prior Publication Data

US 2013/0307087 A1  Nov. 21, 2013

(51) Int. Cl.
*H01L 21/4763* (2006.01)
*H01L 21/44* (2006.01)

(52) U.S. Cl.
USPC ............................ 438/639; 438/586; 438/664

(58) Field of Classification Search
USPC ............................ 438/639, 664, 586; 257/774
See application file for complete search history.

(56) References Cited

U.S. PATENT DOCUMENTS

| 5,150,276 | A  | * | 9/1992  | Gonzalez et al. | 361/313 |
| 6,258,678 | B1 | * | 7/2001  | Liaw | 438/303 |
| 6,348,709 | B1 | * | 2/2002  | Graettinger et al. | 257/311 |
| 6,399,512 | B1 | * | 6/2002  | Blosse et al. | 438/723 |
| 6,555,865 | B2 | * | 4/2003  | Lee et al. | 257/314 |
| 6,710,413 | B2 | * | 3/2004  | Thei et al. | 257/382 |
| 6,828,160 | B2 | * | 12/2004 | Liu | 438/3 |
| 7,064,026 | B2 | * | 6/2006  | Kim et al. | 438/230 |
| 2011/0084320 | A1 | * | 4/2011 | Jung | 257/288 |
| 2011/0108930 | A1 | * | 5/2011 | Cheng et al. | 257/412 |

* cited by examiner

*Primary Examiner* — Luan C Thai
(74) *Attorney, Agent, or Firm* — Ditthavong Mori & Steiner, P.C.

(57) ABSTRACT

A self-aligned source/drain contact formation process without spacer or cap loss is described. Embodiments include providing two gate stacks, each having spacers on opposite sides, and an interlayer dielectric (ILD) over the two gate stacks and in a space therebetween, forming a vertical contact opening within the ILD between the two gate stacks, and laterally removing ILD between the two gate stacks from the vertical contact opening toward the spacers, to form a contact hole.

20 Claims, 13 Drawing Sheets

METHOD FOR FORMING A SELF-ALIGNED CONTACT OPENING BY A LATERAL ETCH

TECHNICAL FIELD

The present disclosure relates to a method for forming a self-aligned contact opening by a lateral etch. The present disclosure is particularly applicable to forming a self-aligned contact opening in a semiconductor device without removing any portion of a gate stack cap.

BACKGROUND

The integration of hundreds of millions of circuit elements, such as transistors, on a single integrated circuit necessitates further scaling down or micro-miniaturization of the physical dimensions of the circuit elements, including interconnection structures. Micro-miniaturization has engendered a dramatic increase in transistor engineering complexity, resulting in several problems.

One such problem is associated with the continuous scaling of complementary metal-oxide semiconductor (CMOS) processing requiring a borderless source/drain contact (or self-aligned S/D contact (SAC)). A conventional source/drain contact has a problem of gate-to-S/D short when the gate-to-gate pitch is further scaled. A borderless SAC prevents the gate from connecting to the S/D contact and enables a greater process window.

To realize the borderless SAC in a replacement metal gate CMOS integration scheme, one method is to form a dielectric capping layer on top of the gate to isolate the gate from the S/D contact. Theoretically, a dielectric capping layer formed to a thickness of 5 to 10 nm (depending on materials) should be good enough to isolate the S/D contact from the gate electrode. However, because of significant dielectric cap loss during the borderless contact etch, the thickness for an effective capping layer is significantly higher. For example, a capping layer of at least a thickness 20 nm is needed for enabling a SAC scheme. However, there are certain challenges associated with forming such a thick capping layer. For instance, it is challenging to form such a thick capping layer by oxidation or selective dielectric growth techniques. Further, although a metal recess followed by a dielectric capping layer deposition and polishing process is a possible approach, the higher gate height required because of the thicker dielectric capping layer results in greater burdens to the replacement metal gate fill.

A need therefore exists for methodology enabling a new contact formation scheme that reduces cap loss without increasing cap thickness, and the resulting device.

SUMMARY

An aspect of the present disclosure is an efficient method of laterally forming a contact hole for an S/D region in a semiconductor device.

Another aspect of the present disclosure is a semiconductor device with a contact hole formed through an interlayer dielectric layer between gate stacks including caps with identical, uniform heights.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing two gate stacks, each having spacers on opposite sides, and an interlayer dielectric (ILD) over the two gate stacks and in a space therebetween, forming a vertical contact opening within the ILD between the two gate stacks, and laterally removing ILD between the two gate stacks from the vertical contact opening toward the spacers, to form a contact hole.

Aspects of the present disclosure include forming the vertical contact opening without removing any portion of the spacers, to form a borderless contact opening. An additional aspect includes forming the vertical contact opening by etching with high selectivity to the spacers. Yet another aspect includes the forming of the vertical contact opening further including removing part of a spacer of one of the gate stacks, to form a non-borderless vertical contact opening. Another aspect of the present disclosure includes forming the vertical contact opening down to a source/drain layer below the ILD. A further aspect includes forming the vertical contact opening with a bottom of the vertical contact opening within the ILD. An additional aspect includes the bottom of the vertical contact opening coming to a point within the ILD. Additional aspects include forming a hardmask layer above the ILD prior to forming the vertical contact opening, forming a hole through the hardmask layer, and forming the vertical contact opening within the ILD from the hole in the hardmask layer. A further aspect includes laterally removing the ILD between the hardmask layer and an S/D region between the two gate stacks to form the contact hole. Another aspect includes forming the vertical contact opening with a reactive ion etch. An additional aspect includes forming the vertical contact opening to a width of 5 to 10 nm. A further aspect includes the spacers being formed of silicon nitride (SiN), and laterally removing the ILD between the two gate stacks by etching with a high selectivity to SiN. Another aspect includes laterally removing the ILD to form the contact hole to a top width of 20 to 40 nm.

Another aspect of the present disclosure includes providing two gate stacks, each having spacers on opposite sides, and ILD over the two gate stacks and in a space therebetween, forming a hardmask layer above the ILD, forming a hole through the hardmask layer over the space, forming a vertical contact opening within the ILD between the two gate stacks through the hole in the hardmask layer, and laterally etching the ILD between the two gate stacks from the contact opening toward the spacers, to form a contact hole. An additional aspect includes forming a notch in an S/D region between the two gate stacks during formation of the vertical contact opening, wherein the vertical contact opening and the notch in the S/D region are formed to a width of 5 to 10 nm.

Another aspect of the present disclosure is a device including: a substrate, two gate stacks on the substrate, each gate stack including a pair of spacers and a cap, ILD over and between the gate stacks, and a contact opening formed within the ILD between the gate stacks and overlying part of at least one cap, with the caps of the two gate stacks having identical, uniform heights.

Aspects include a device including caps formed to a height of 5 to 10 nm. An additional aspect includes the cap and the pair of spacers for each of the two gate stacks forming shoulders, and the shoulders of each of the two gate stacks being symmetrical. A further aspect includes the caps being rectangular. Another aspect includes raised S/D regions on the substrate on opposite sides of each of the two gate stacks.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of capping layer loss resulting in gate-to-source/drain shorts or increased capping layer thickness attendant upon forming borderless S/D contact holes. In accordance with embodiments of the present disclosure, a lateral blowout of ILD between two gate stacks with pairs of spacers and caps is performed to create the contact opening.

Methodology in accordance with embodiments of the present disclosure includes providing two gate stacks, each having spacers on opposite sides, and ILD over the two gate stacks and in a space therebetween. A vertical contact opening is then formed within the ILD between the two gate stacks. The vertical contact opening may be formed without removing any portion of the spacers down to a source/drain layer below the ILD, to form a borderless contact opening. The vertical contact opening may be formed to a width of 5 to 10 nm. Next, the ILD between the two gate stacks is laterally removed from the contact opening toward the spacers, to form a contact hole. The contact hole may be formed to a top width of 20 to 40 nm.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
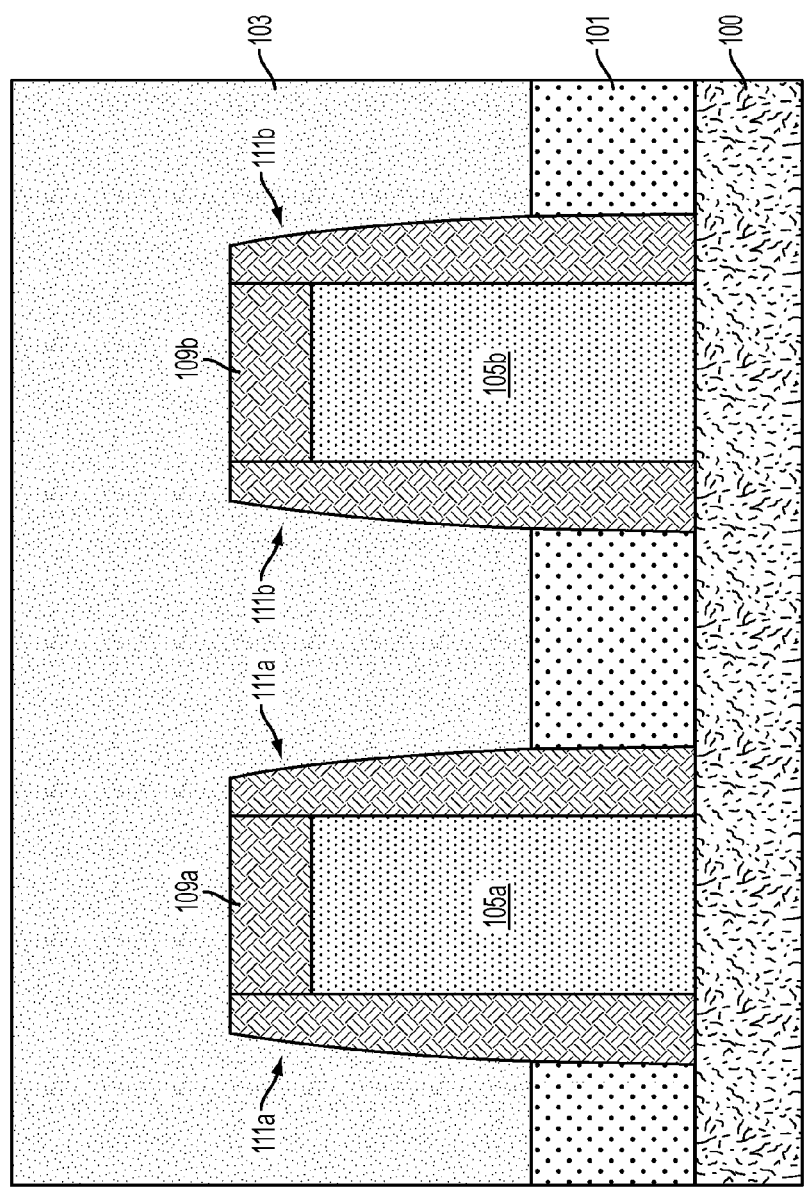
FIGS. 1A through 3 schematically illustrate steps for forming an S/D contact hole, in accordance with an exemplary embodiment.
Figure 1B:
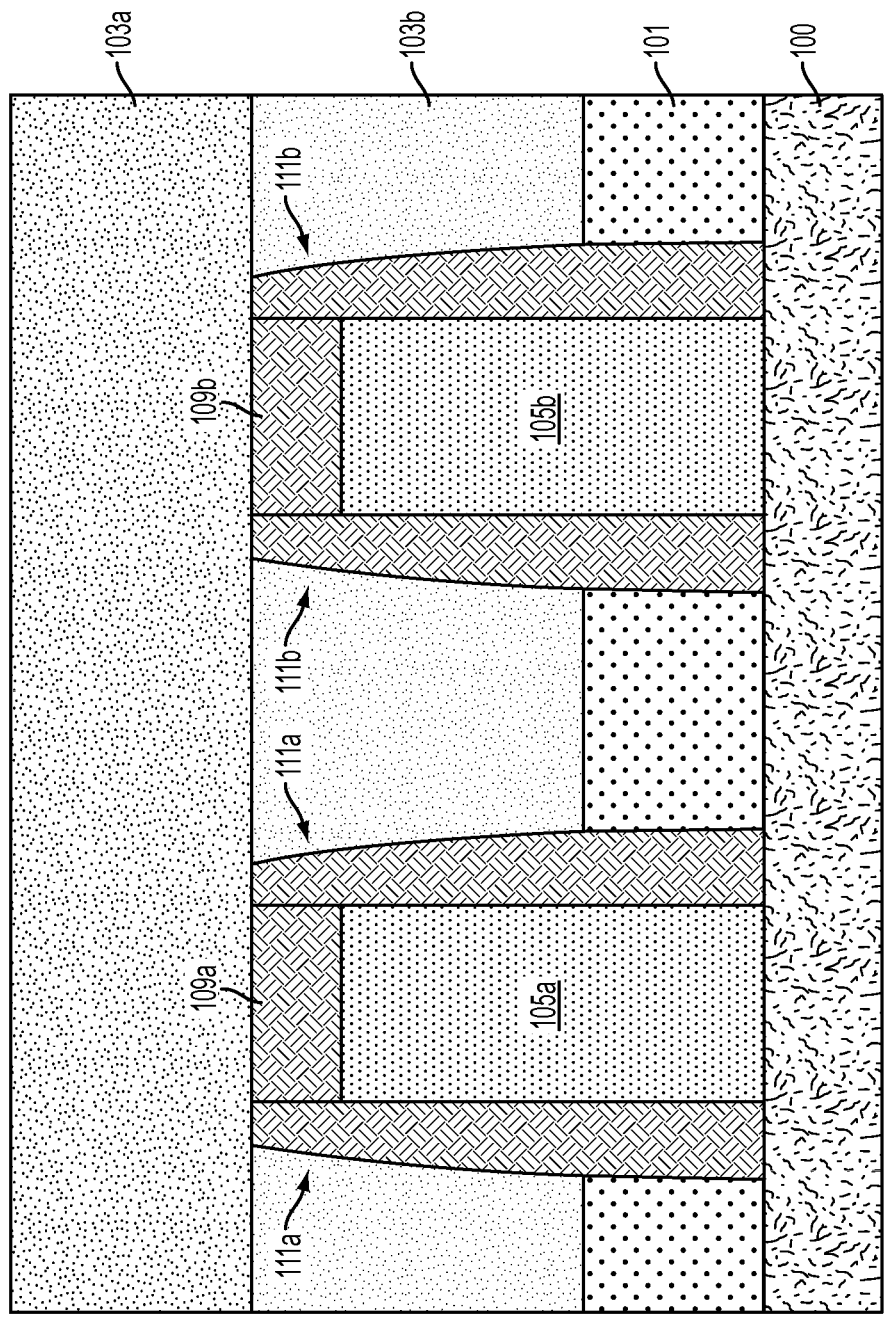

The present disclosure is directed to various methods of forming contact holes for various types of semiconductor devices, such a FinFETs and planar field effect transistors. As will be readily apparent to those skilled in the art upon a complete reading of the present application, the methods and devices disclosed herein may be applicable to a variety of technologies, e.g., NFET, PFET, CMOS, etc., and they are readily applicable to a variety of devices, including, but not limited to, ASICs, logic devices, memory devices, etc. The methods herein disclosed may be performed for both gate first and gate last process flows and are applicable to any gate pitch, such as gate pitches of less than 76 nm. Adverting to FIG. 1A, a method for forming a semiconductor device by lateral removal of the ILD, in accordance with an exemplary embodiment, begins with a substrate 100 including a raised S/D region 101 and a pair of gate stacks 105a and 105b. The substrate 100 may be formed of any type of semiconductor material, such as silicon (Si). The pair of gate stacks 105a and 105b are surrounded by rectangular caps 109a and 109b and pairs of spacers 111a and 111b. The pairs of spacers 111a and 111b and the caps 109a and 109b may be formed of a same nitride material, such as silicon nitride (SiN), or may be formed with different materials, e.g., 111a and 111b could be SiN while 109a and 109b could be silicon carbon nitride (SiCN), or silicon carbon boron nitride (SiCBN). The caps 109a and 109b may be formed to a height as thin as 5 to 10 nm (but the caps may alternatively be thicker, e.g., as thick as 30-50 nm). The substrate 100 also includes ILD 103 over and between the pair of gate stacks 105a and 105b. Alternatively, as illustrated in FIG. 1B, the substrate 100 may include ILD 103a over the gate stacks 105a and 105b and ILD 103b between the gate stacks 105a and 105b. The ILD 103a may be formed of an oxide, a nitride or a low-k ILD material. The ILD 103b may be formed of an oxide ILD material. Thus, the ILD 103a and the ILD 103b may be formed of the same material, as illustrated in FIG. 1A and throughout the remaining drawings, or of different materials. Although not illustrated (for purposes of illustrative convenience), ILD 103b may be further divided into two different layers being formed of two different ILD materials.

Figure 2A:
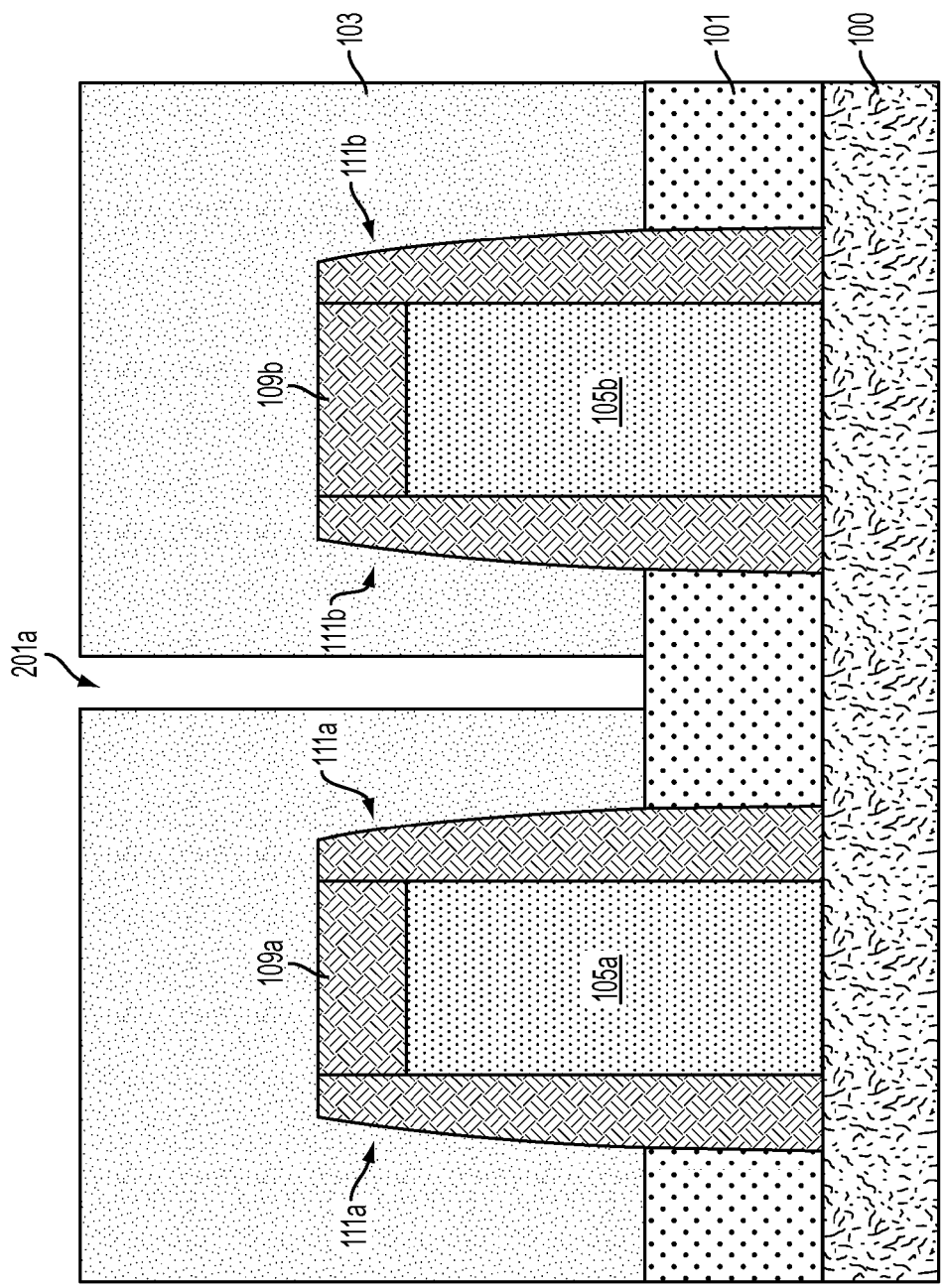
Figure 2B:
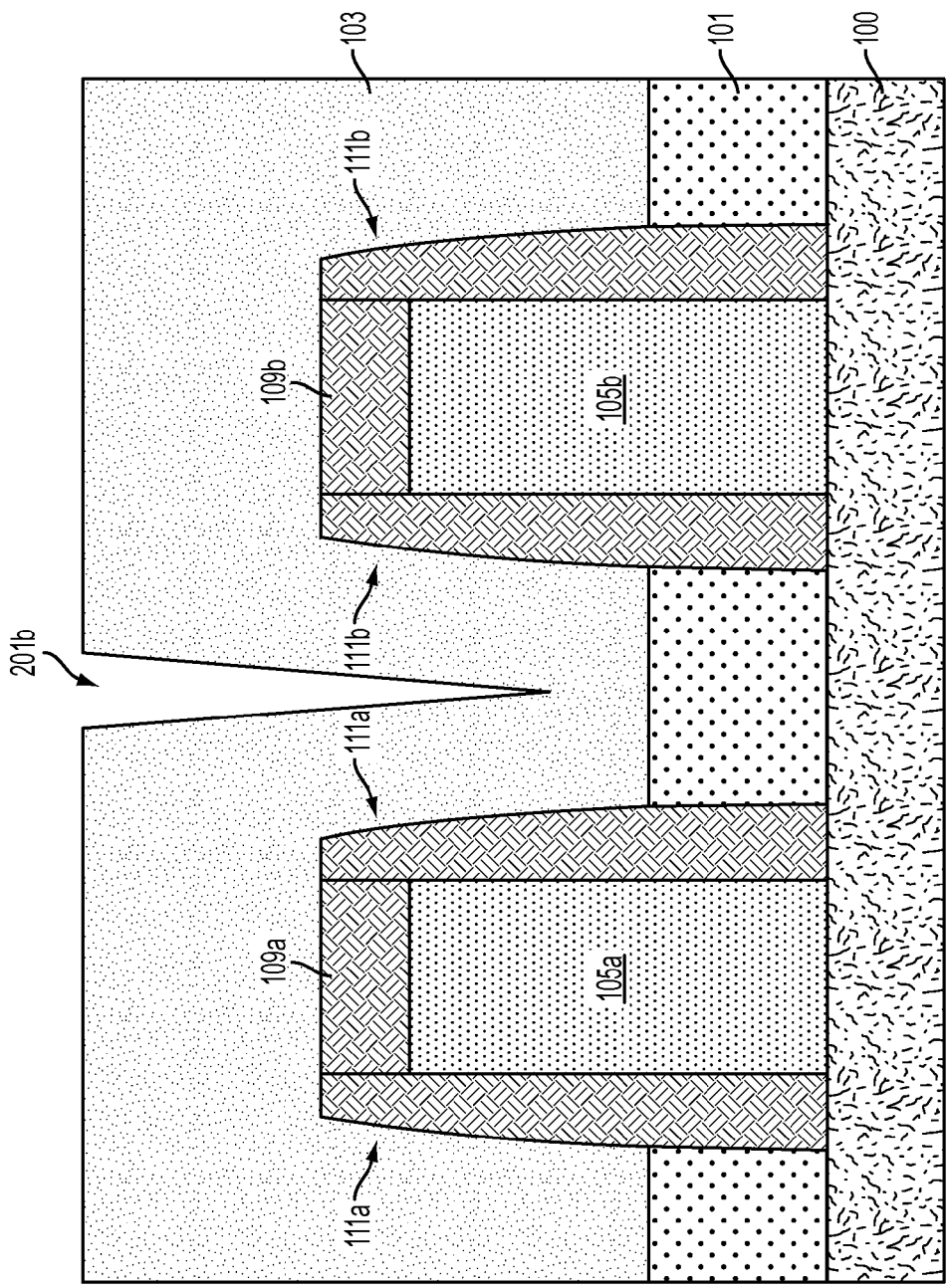

Next, as illustrated in FIG. 2A, the method proceeds with forming a vertical contact opening 201a within the ILD 103 between the two gate stacks 105a and 105b down to the raised S/D region 101. The vertical contact opening 201a may be formed using a reactive ion etch to a width of 5 to 10 nm. For example, for a gate stack pitch of 64 nm, the width of the vertical contact opening 201a may be 6 nm. Alternatively, as illustrated in FIG. 2B, a vertical contact opening 201b may be formed with a bottom of the vertical contact opening 201b coming to a point within the ILD 103. The vertical contact opening 201b in FIG. 2B allows for a greater misalignment tolerance because of the narrower critical dimension of the vertical contact opening 201b, as discussed further below.

Figure 3:
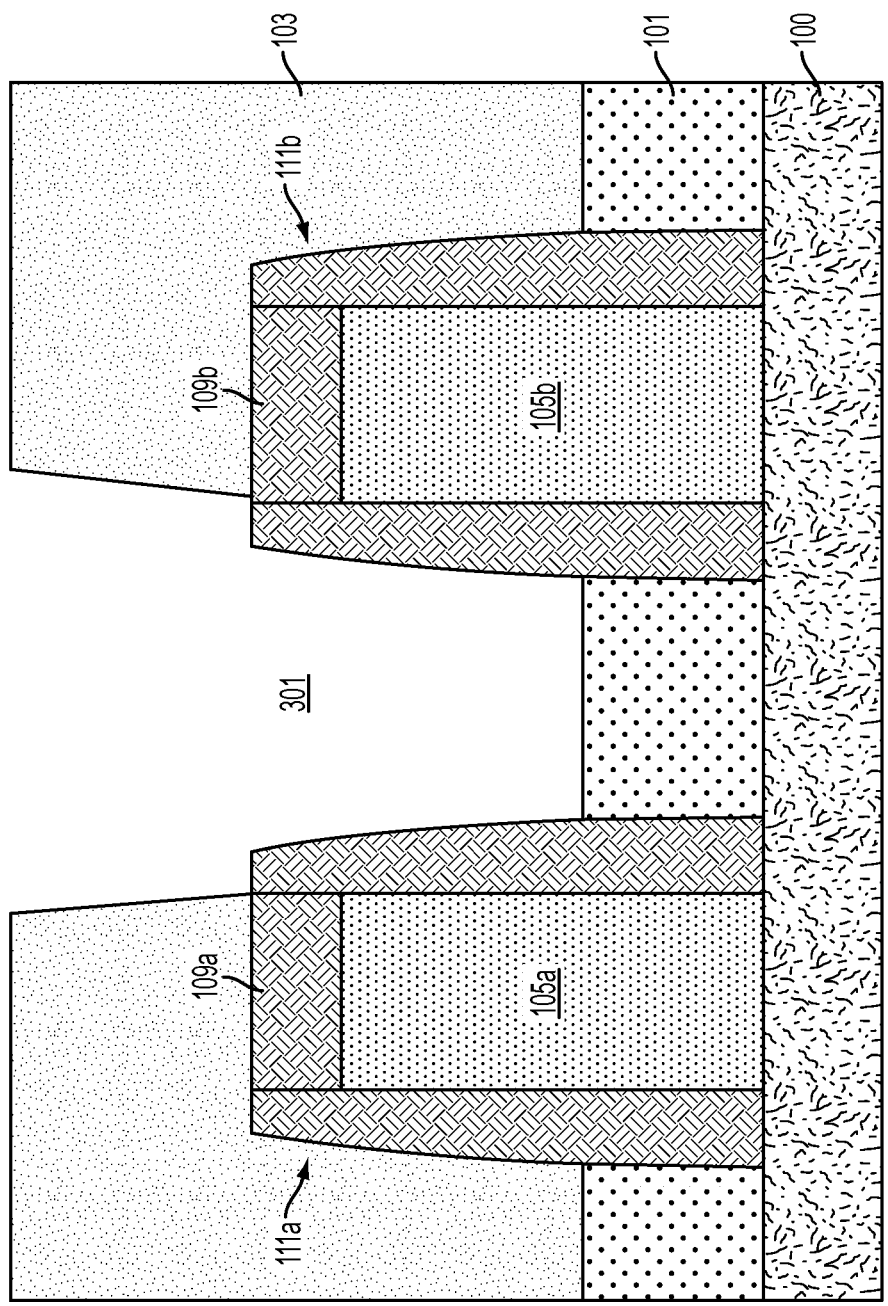

Adverting to FIG. 3, the ILD 103 between the gate stacks 105a and 105b is laterally removed from the vertical contact opening 201a (or 201b) toward the pairs of spacers 111a and 111b forming a contact hole 301. The contact hole 301 may be formed to a top width of 20 to 40 nm depending on several factors, such as, for example, the gate pitch, the gate length, the spacer width and the size of the vertical contact opening 201. For example, for a gate stack pitch of 64 nm, the contact hole 301 may be formed to a top width of 30 nm. For a gate stack pitch of 56 nm, the contact hole 301 may be formed to a top width of, for example, 20 nm. The ILD 103 may be removed based on a lateral etch. The lateral etch can be a dry etch or a wet etch. For example, where ILD 103 is an oxide-based material (or where ILD 103a and ILD 103b are both oxide-based materials), the lateral etch process can be based on dilute hydrofluoric acid (HF), chemical oxide removal (COR), or a silicon-containing material (e.g., SiCoNi™). The lateral etch process can be highly selective to the nitride-based pairs of spacers 111a and 111b and caps 109a and 109b. By way of example, a chemical oxide removal process of a gaseous phase etch at room temperature, with a mixture of hydrofluoric acid, ammonia and argon for dilution, has an oxide-to-nitride ($SiO_2$ to SiN) selectivity of greater than 40:1. Accordingly, the lateral etch and high selectivity allows for formation of the contact hole 301 without removal any portion of the caps 109a and 109b or pairs of spacers 111a and 111b.

Figure 4:
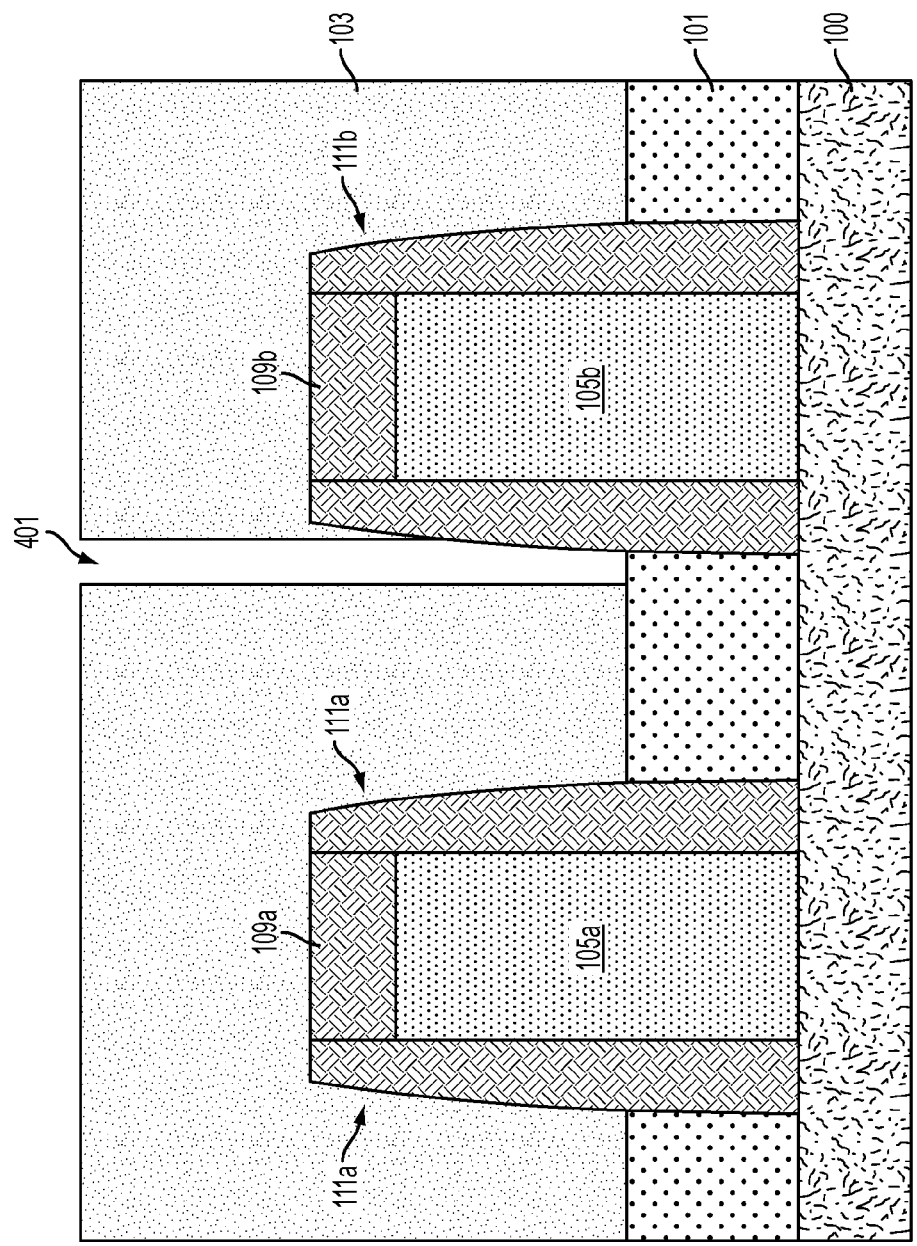
FIGS. 4 and 5 schematically illustrate steps for forming an S/D contact hole, in accordance with another exemplary embodiment.

The process also allows for a high misalignment tolerance based on the selectivity to the caps 109a and 109a and the pairs of spacers 111a and 111b. For example, FIG. 4 illustrates a misaligned vertical contact opening 401. Rather than being formed without touching one of the pairs of spacers 111a and 111b, as illustrated in FIGS. 2A and 2B, the vertical contact opening 401 may be formed, for example, touching the left spacer of the pair of spacers 111b. However, because of the high selectivity to nitride, the vertical contact opening 401 may be formed without much damage to spacers 111b. Thus, the vertical contact opening 401 forms a borderless contact opening.

Figure 5:
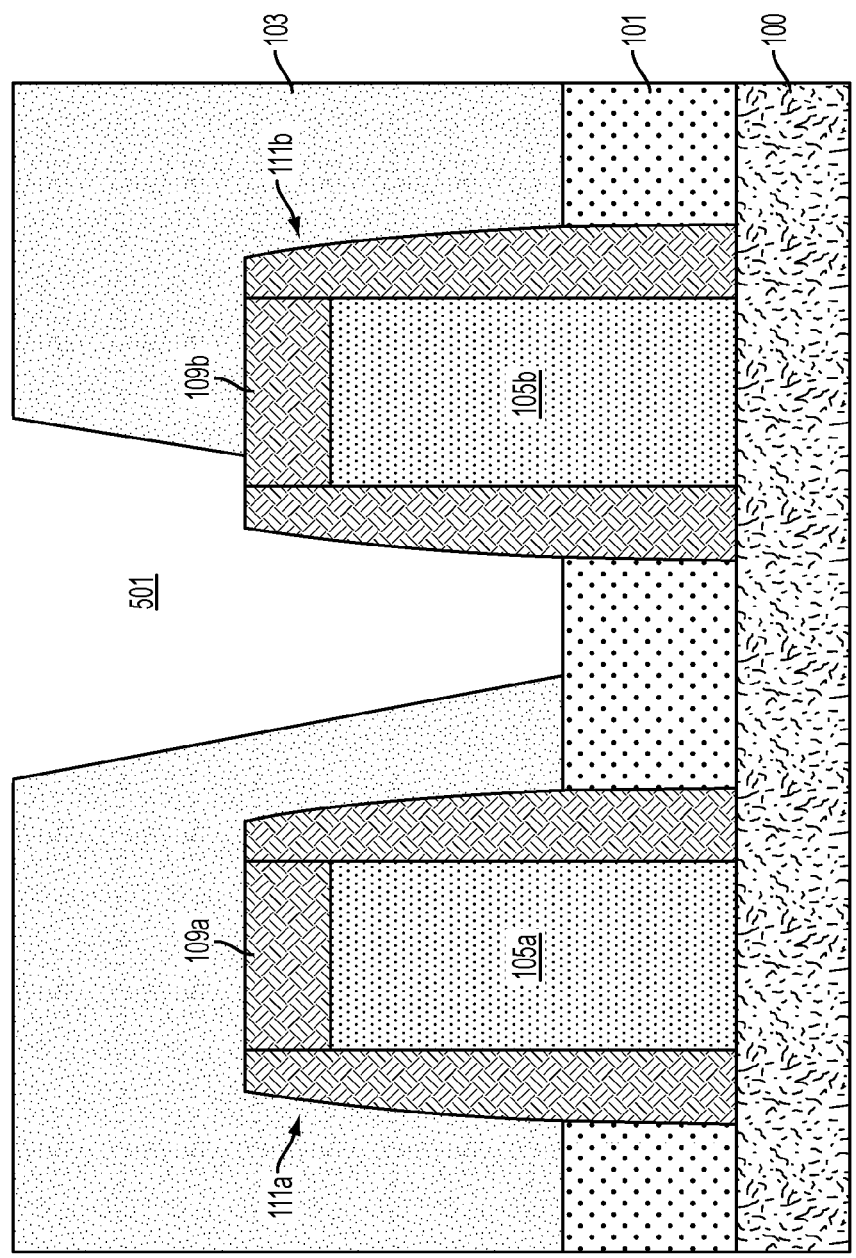

As illustrated in FIG. 5, the subsequent lateral etch of the ILD 103 as described above with respect to FIG. 3 forms a contact hole 501 without removing any portion of the spacers 111b or the cap 109b. Based on the high selectivity to nitride, the misalignment tolerance may be up to, for example, 13 nm for a 64 nm gate pitch. Thus, for example, the caps 109a and 109b may have identical, uniform heights after formation of the contact hole 501, and the shoulders formed by the caps 109a and 109b and the pairs of spacers 111a and 111b of the two gate stacks 105a and 105b remain symmetrical.

Figure 6:
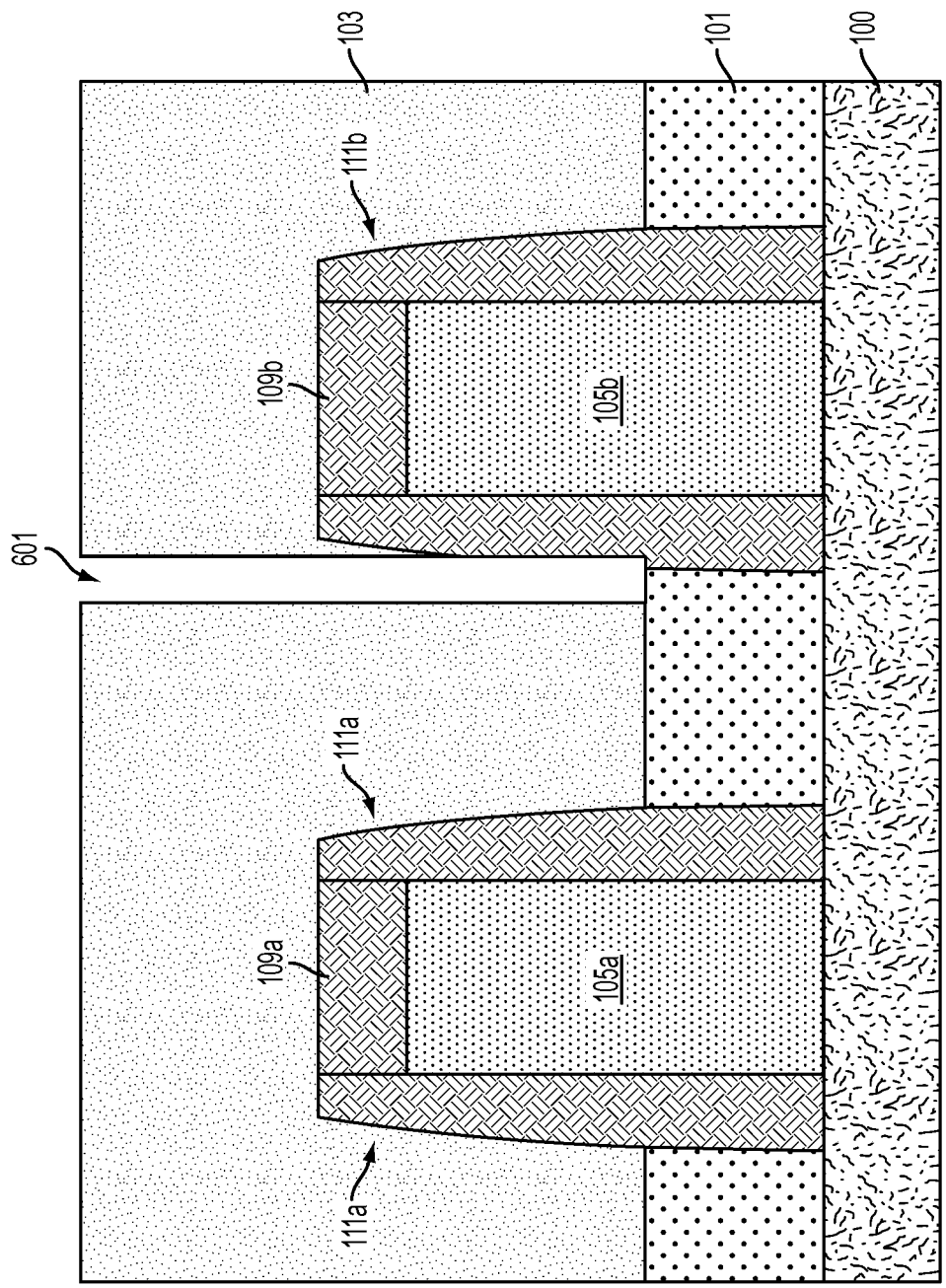
FIGS. 6 and 7 schematically illustrate steps for forming an S/D contact hole, in accordance with yet another exemplary embodiment.
Figure 7:
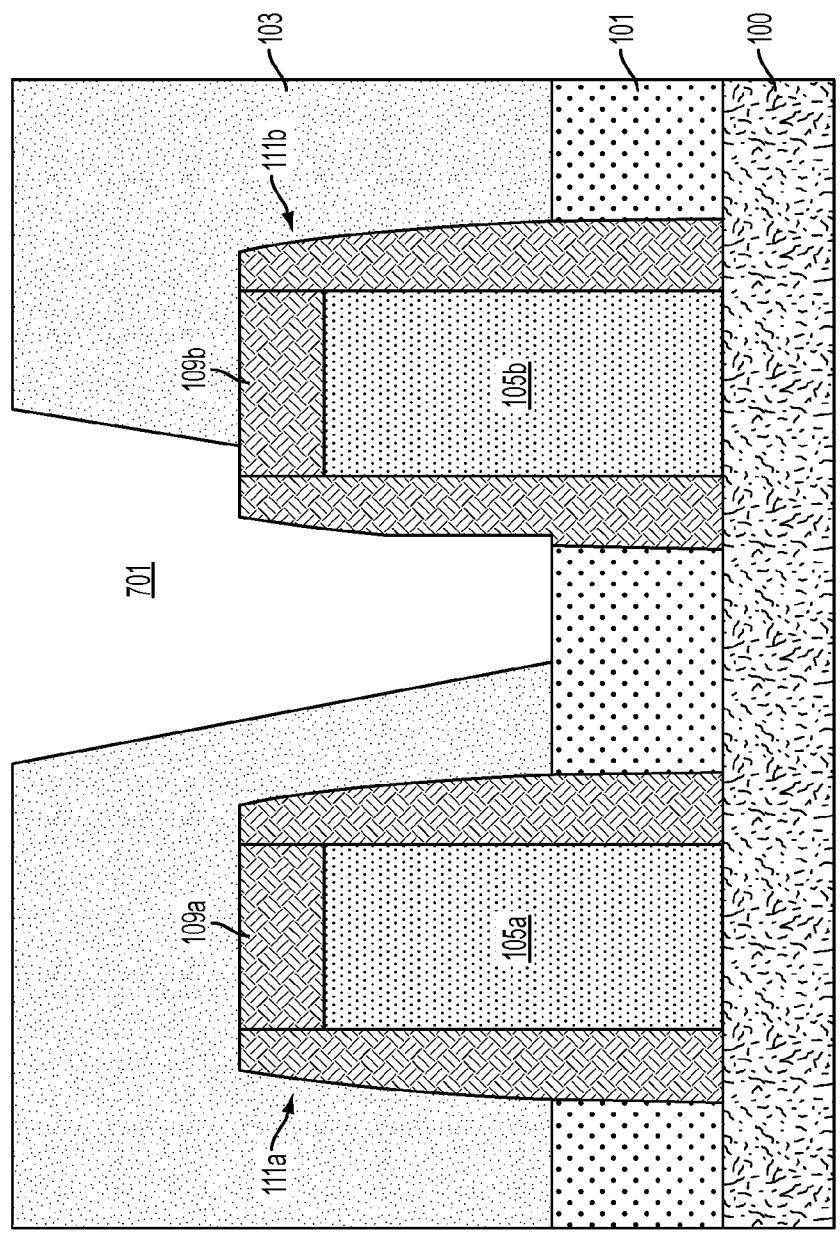

Adverting to FIG. 6, an alternative example with respect to forming the vertical contact opening is illustrated. Unlike the process illustrated in FIG. 4, the removal of the ILD 103 may not be as selective to the nitride-based materials of the cap 109b and the spacers 111b. Thus, a portion of the left spacer of the pair of spacers 111b may be removed during the formation of the non-borderless vertical contact opening 601. However, as illustrated in FIG. 7, the subsequent lateral etch of the ILD 103, as described above with respect to FIGS. 3 and 5, forms the contact hole 701 without any further removal of the spacers 111b or the cap 109b based on the high selectivity to nitride during the lateral etch.

Figure 8:
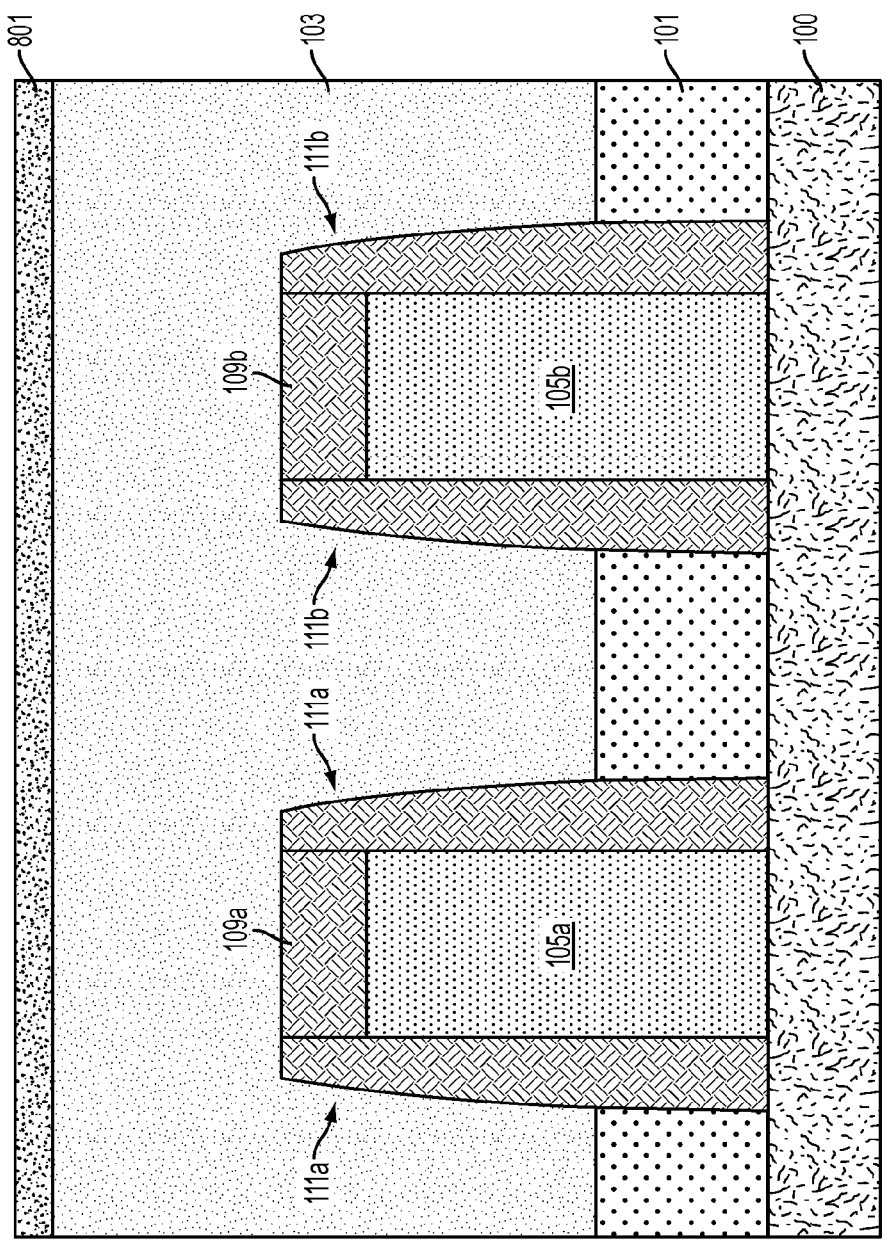
FIGS. 8 through 11 schematically illustrate steps for forming an S/D contact hole, in accordance with a further exemplary embodiment.
Figure 9:
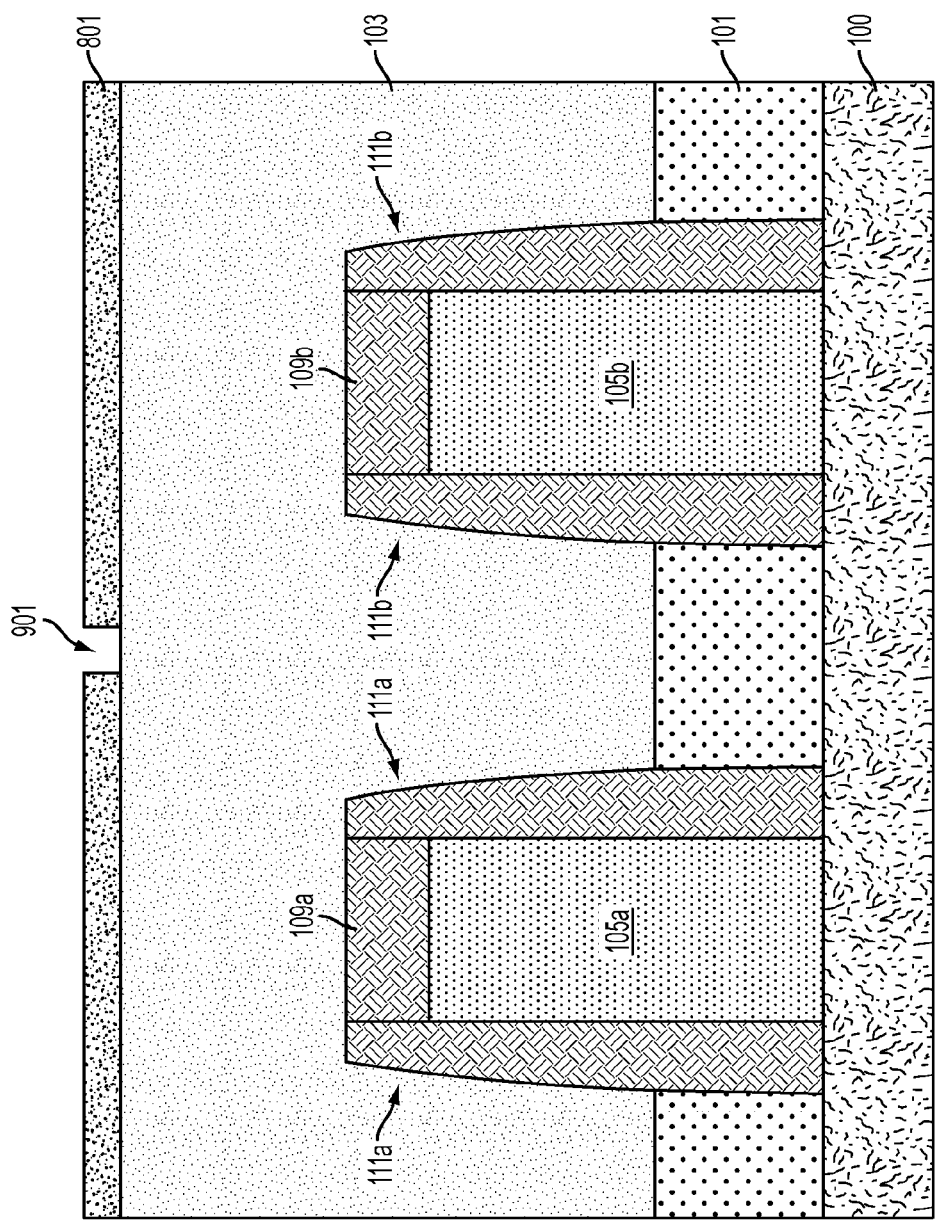

In a further alternative example, prior to the formation of the vertical contact opening 201a of, for example, FIG. 2A, a hardmask layer 801 may be formed over the ILD 103, as illustrated in FIG. 8. The hardmask layer 801 may be formed of, for example, SiN or Si and to a thickness of 3 to 6 nm (e.g., 3 nm).

Figure 10:
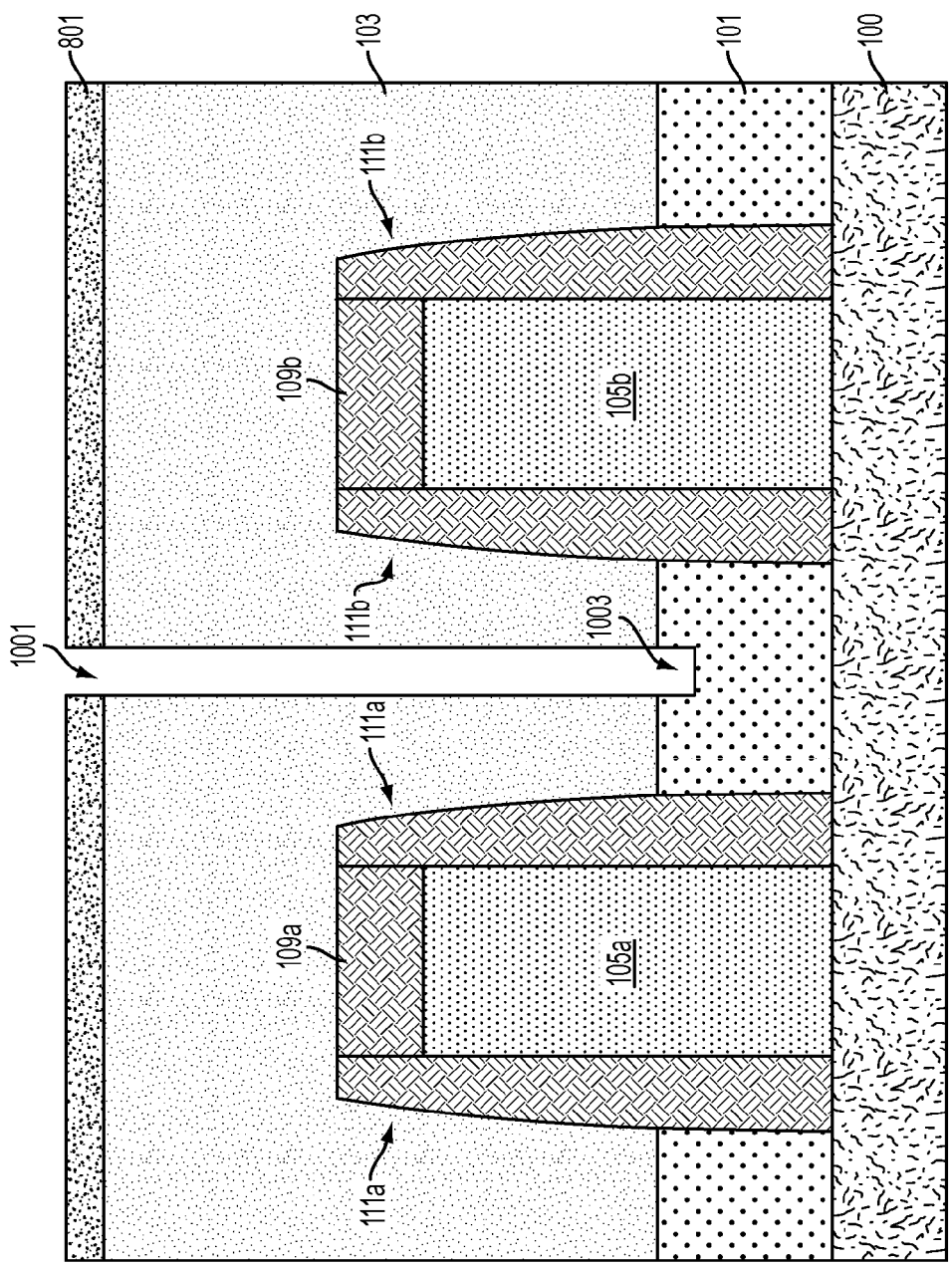

Next, a hole 901 may be formed through the hardmask layer 801. The formation of the hole 901 may cause some loss of the ILD 103 (not shown for illustrative convenience). As illustrated in FIG. 10, a vertical contact opening 1001 is then formed through the hole 901, as described above with respect to, for example, FIGS. 2A and 2B. The formation of the vertical contact opening 1001 may be a secondary step after formation of the hole 901 in the hardmask layer 801, or may be a continuation of the step of forming the hole 901. Further, formation of the vertical contact opening 1001 may form a notch 1003 in the source/drain region 101 by removing some of the material of the source/drain region 101. Although not shown for illustrative convenience, a notch may be formed in the formation of the vertical contact openings 201a, 401 and 601 depending on the properties of the etch. The notch 1003 may be the same width as the width of the vertical contact opening (e.g., 5 to 10 nm).

Figure 11:
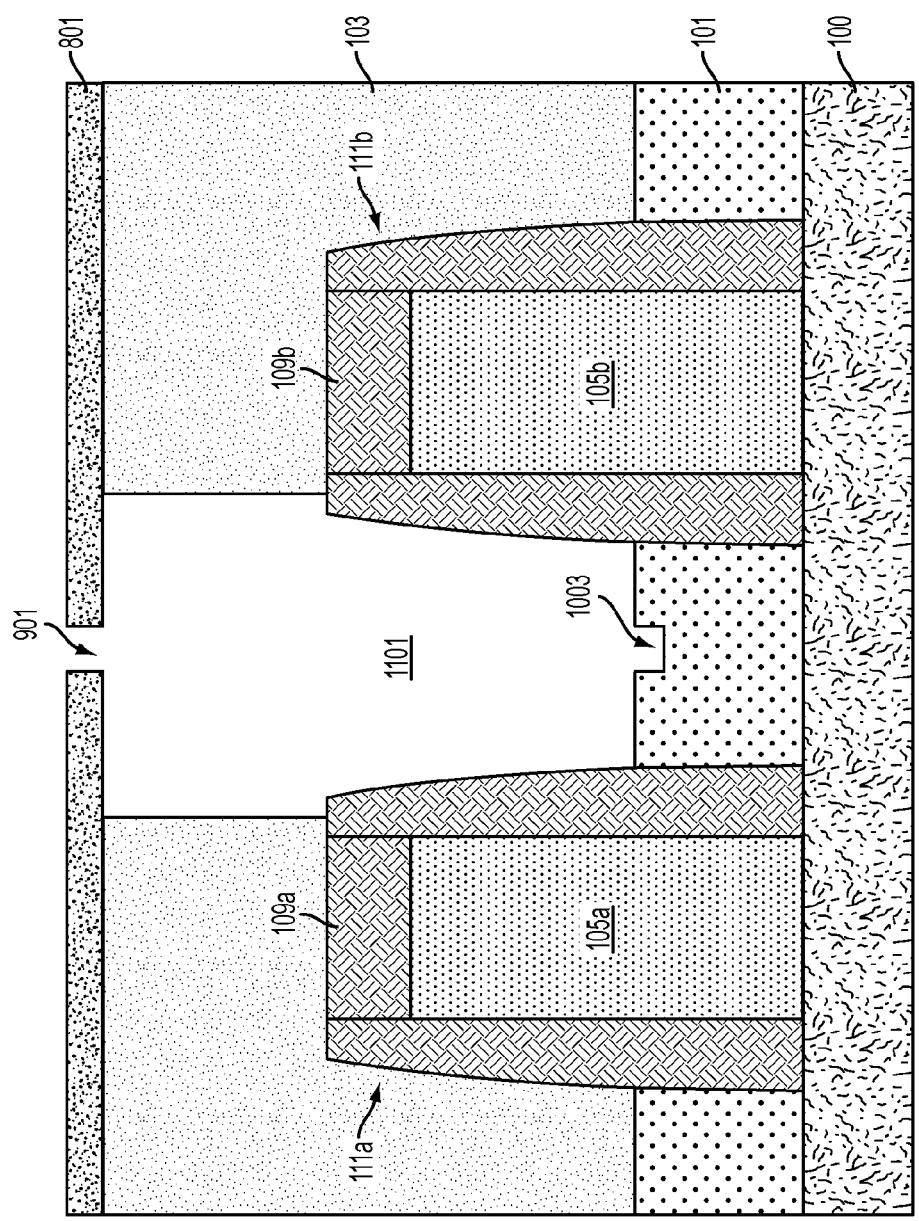

Subsequent to the formation of the vertical contact opening 1001, the ILD 103 between the gate stacks 105a and 105b is laterally removed (as described with respect to FIG. 3) from the vertical contact opening 1001 toward the pairs of spacers 111a and 111b forming a contact hole 1101, as illustrated in FIG. 11. However, the hardmask layer 801 allows for a lateral etching of the ILD 103 without causing rounded corners on the top surface of the ILD 103. Further, because of the selectivity of the lateral etch, the notch 1003 is not enlarged during the removal of the ILD 103. The hardmask layer 801 can be optionally removed after the lateral etch.

The embodiments of the present disclosure achieve several technical effects, including a self-aligned S/D contact without spacer or cap loss on the gate stacks. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing two gate stacks, each having spacers on opposite sides, and an interlayer dielectric (ILD) over the two gate stacks and in a space therebetween;
    forming a vertical contact opening within the ILD between the two gate stacks; and
    laterally removing ILD between the two gate stacks from the vertical contact opening toward the spacers, to form a contact hole.

2. The method according to claim 1, comprising forming the vertical contact opening without removing any portion of the spacers, to form a borderless contact opening.

3. The method according to claim 2, comprising forming the vertical contact opening by etching with high selectivity to the spacers.

4. The method according to claim 1, the forming of the vertical contact opening further comprising removing part of a spacer of one of the gate stacks, to form a non-borderless vertical contact opening.

5. The method according to claim 1, further comprising forming the vertical contact opening down to a source/drain layer below the ILD.

6. The method according to claim 1, further comprising forming the vertical contact opening with a bottom of the vertical contact opening within the ILD.

7. The method according to claim 6, wherein the bottom of the vertical contact opening comes to a point.

8. The method according to claim 1, further comprising:
forming a hardmask layer above the ILD prior to forming the vertical contact opening;
forming a hole through the hardmask layer; and
forming the vertical contact opening within the ILD from the hole in the hardmask layer.

9. The method according to claim 8, further comprising laterally removing the ILD between the hardmask layer and a source/drain region between the two gate stacks to form the contact hole.

10. The method according to claim 1, further comprising forming the vertical contact opening with a reactive ion etch.

11. The method according to claim 1, further comprising forming the vertical contact opening to a width of 5 to 10 nm.

12. The method according to claim 1, wherein the spacers comprise silicon nitride (SiN), the method comprising:
laterally removing the ILD between the two gate stacks by etching with a high selectivity to SiN.

13. The method according to claim 1, further comprising laterally removing the ILD to form the contact hole to a top width of 20 to 40 nm.

14. A device comprising:
a substrate;
two gate stacks on the substrate, each gate stack including a pair of spacers and a cap;
an interlayer dielectric (ILD) over and between the gate stacks; and
a contact opening formed within the ILD between the gate stacks and overlying part of at least one cap, wherein the caps of the two gate stacks have identical, uniform heights.

15. The device according to claim 14, wherein the caps are formed to a height of 5 to 10 nm.

16. The device according to claim 14, wherein the cap and the pair of spacers for each of the two gate stacks form shoulders, and the shoulders of each of the two gate stacks are symmetrical.

17. The device according to claim 14, wherein the caps are rectangular.

18. The device according to claim 14, further comprising raised source/drain regions on the substrate on opposite sides of each of the two gate stacks.

19. A method comprising:
providing two gate stacks, each having spacers on opposite sides, and an interlayer dielectric (ILD) over the two gate stacks and in a space therebetween;
forming a hardmask layer above the ILD;
forming a hole through the hardmask layer over the space;
forming a vertical contact opening within the ILD between the two gate stacks through the hole in the hardmask layer; and
laterally etching the ILD between the two gate stacks from the contact opening toward the spacers, to form a contact hole.

20. The method according to claim 19, further comprising:
forming a notch in a source/drain region between the two gate stacks during formation of the vertical contact opening, wherein the vertical contact opening and the notch in the source/drain region are formed to a width of 5 to 10 nm.

* * * * *